United States Patent
Nohl et al.

(10) Patent No.: US 8,554,535 B2
(45) Date of Patent: *Oct. 8, 2013

(54) INSTRUCTION-SET ARCHITECTURE SIMULATION TECHNIQUES USING JUST IN TIME COMPILATION

(75) Inventors: Achim Nohl, Aachen (DE); Gunnar Braun, Aachen (DE); Andreas Hoffmann, Herzogenrath (DE); Oliver Schliebusch, Herzogenrath (DE); Rainer Leupers, Dorsten (DE); Heinrich Myer, Borgnone (CH)

(73) Assignee: Synopsys, Inc., Mountain View, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/338,155

(22) Filed: Dec. 27, 2011

(65) Prior Publication Data

US 2012/0158397 A1 Jun. 21, 2012

Related U.S. Application Data

(63) Continuation of application No. 10/309,554, filed on Dec. 3, 2002, now Pat. No. 8,086,438.

(60) Provisional application No. 60/368,439, filed on Mar. 27, 2002.

(51) Int. Cl.
*G06F 9/455* (2006.01)

(52) U.S. Cl.
USPC .......................................................... 703/26

(58) Field of Classification Search
USPC .......................................................... 703/26
See application file for complete search history.

(56) References Cited

U.S. PATENT DOCUMENTS

| 5,167,023 | A | * | 11/1992 | de Nicolas et al. | 703/27 |
| 5,742,802 | A | | 4/1998 | Harter et al. | |
| 5,768,593 | A | | 6/1998 | Brown et al. | |
| 5,966,537 | A | * | 10/1999 | Ravichandran | 717/158 |
| 6,049,866 | A | * | 4/2000 | Earl | 712/227 |
| 6,199,152 | B1 | * | 3/2001 | Kelly et al. | 711/207 |
| 6,463,582 | B1 | * | 10/2002 | Lethin et al. | 717/158 |
| 6,704,925 | B1 | * | 3/2004 | Bugnion | 717/138 |
| 6,772,106 | B1 | * | 8/2004 | Mahlke et al. | 703/21 |

(Continued)

OTHER PUBLICATIONS

Bedichek, R., "Some Efficient Architecture Simulation Techniques", 1990, 12 pages.

(Continued)

*Primary Examiner* — Shambhavi Patel
(74) *Attorney, Agent, or Firm* — Fenwick & West LLP

(57) ABSTRACT

A method of simulating a program. Compiled and interpretive techniques are combined into a just-in-time cached compiled technique. When an instruction of a program simulation is to be executed at run-time, a table of compiled instructions is accessed to determine whether compiled data for the instruction is stored in the table. If the compiled data is not therein, the instruction is compiled and stored in the table. The compiled data is returned to a simulator that is executing the program simulation. In another embodiment, before storing new information in the table, another table may be consulted to determine if the location to which the new information is to be stored is protected. If the table location is protected, the new information is not stored in the table. Rather, the new information is simply passed on to the simulator.

17 Claims, 11 Drawing Sheets

(56) References Cited

U.S. PATENT DOCUMENTS

| | | | |
|---|---|---|---|
| 6,920,550 B2* | 7/2005 | Des li | 712/227 |
| 6,968,546 B2* | 11/2005 | Lueh | 717/158 |
| 7,047,394 B1* | 5/2006 | Van Dyke et al. | 712/209 |
| 7,107,580 B2* | 9/2006 | Zemach et al. | 717/136 |
| 2002/0133810 A1* | 9/2002 | Giles et al. | 717/138 |
| 2002/0147969 A1* | 10/2002 | Lethin et al. | 717/138 |

OTHER PUBLICATIONS

Braun, G. et al., "Using Static Scheduling Techiques for the Retargeting of High Speed, Compiled Simulators for Embedded Processors From an Abstract Machine Description," In Proc. of the Int. Symposium on System Synthesis, ISSS'01, ACM, Oct. 1-3, 2001, pp. 57-62.

Cmelik, B. et al. "Shade: A Fast Instruction-Set Simulator for Execution Profiling", SIGMETRICS 94-5, ACM 1994, pp. 128-137.

Ebciouglu, K. et al. "Dynamic Binary Translation and Optimization", IEEE Transactions on Computers, Jun. 2001, pp. 529-548, vol. 50, No. 6.

Engel, F. et al., "A Generic Tool Set for Application Specific Processor Architectures," In Proc. of the Int. Workshop on Hw/SW Codesign, 1999, 5 pages.

European Search Report, European Application No. 03006928.0, Oct. 21, 2004, 3 pages.

European Examination Report, European Application No. 03006928.0, Communication Pursuant to Article 96(2) EPC, Jun. 23, 2005, 7 pages.

European Examination Report, Communication Pursuant to Article 96(2) EPC, European Application No. 03006928.0, Jun. 26, 2006, 3 pages.

European Examination Report, Communication Pursuant to Article 96(2) EPC, European Application No. 03006928.0, Nov. 21, 2007, 4 pages.

European Summons to Attend Oral Proceedings Pursuant to Rule 115(1) EPC, European Application No. 03006928.0, Jun. 12, 2008, 4 pages.

European Summons to Attend Oral Proceedings Pursuant to Rule 115(1) EPC, European Application No. 03006928.0, Jul. 3, 2008, 5 pages.

European Decision to Refuse a European patent application, European Application No. 03006928.0, Sep. 22, 2008, 4 pages.

Hadjiyiannis, G. et al., "ISDL: An Instruction Set Description Language for Retargetability," In Proc. of the Design Automation Conference, 1997, 4 pages.

Hagersten, E. et al. "Simple COMA Node Implementations", 1994, 12 pages.

Halambi, A. et al., "Expression: A Language for Architecture Exploration Through Compiler/Simulator Retargetability," In Proc. of the Conference on Design, Automation & Test in Europe, 1999, pp. 1-6.

Hartoog, M.R. et al., "Generation of Software Tools From Processor Descriptions for Hardware/Software Codesign," In Proc. of the Design Automation Conference, ACM, 1997, 4 pages.

Hoffman, A. et al., "A Methodology for the Design of Application Specific Instruction Set Processors (ASIP) Using the Machine Description Language LISA," IEEE Transactions on Computer-Aided Design, 2001, pp. 1338-1354, vol. 20, No. 11.

Keppel, D., "A Portable Interface for On-the-Fly Instruction Space Modification", ACM, 1991, pp. 86-95.

Leupers, R. et al., "Generation of Interpretive and Compiled Instruction Set Simulators," In Proc. of the Asia South Pacific Design Automation Conference, Jan. 1999, 4 pages.

Magnusson, P. et al., "Efficient Memory Simulation in SimICS," IEEE, 1995, pp. 6272.

Mills, C. et al. "Compiled Instruction Set Simulation", Software—Practice and Experience, Aug. 1991, pp. 877-889. vol. 21, No. 8.

Pees, S. et al., "Retargetable Compiled Simulation of Embedded Processors Using a Machine Description Language," ACM Transactions on Design Automation of Electronic Systems, ACM Press, Oct. 2000, pp. 815-834, vol. 5, No. 4.

Pees, S. et al., "LISA-Machine Description Language for Cycle-Accurate Models of Programmable DSP Architectures," Proceedings of the $36^{th}$ Design Automation Conference, Jun. 21, 1999, pp. 933-938.

Schnarr, E.C. et al.; "Facile: A Language and Compiler for High Performance Processor Simulators," In Proc. of the Conf. on Programming Language Design and Implementation, ACM, 1998, pp. 1-11.

Schnarr, E. et al., "Fast Out-of-Order Processor Simulation Using Memorization," in Proc. 8th International Conference on Architectural Support for Programming Languages and Operating Systems (ASPLOS-VIII), Oct. 1998, 12 pages.

Schnarr, A.C. et al., "Facile: A Language and Compiler for High-Performance Processor Simulators," The ACM Digital Library, ACM Press, May 2001, pp. 321-331.

Witchel, E. et al.; "Embra: Fast and Flexible Machine Simulation," In Proc. of the Conf. on Measurement and Modeling of Computer Systems, SIGMETRICS 96, ACM, 1996, pp. 68-79.

Zhu, J. et al. "A Retargetable, Ultra-Fast Instruction Set Simulator", Mar. 1999, 5 pages.

* cited by examiner

```
510 — RESOURCE {
  512 — PROGRAM_MEMORY byte8 prog_mem[0x0..0x1000];
  514 — REGISTER         word32 R[1..15];
}
520 — OPERATION ADD {
  521 — DECLARE  { GROUP dst,src1,src2 == {Register}}
  522 — CODING   { 0b01011 0b0000 src1 src2 dst}
  523 — SYNTAX   { "ADD" dst " , " src1 " , " src2 }
  524 — BEHAVIOR( dst = src1 + src2)
}
530 — OPERATION Register {
  521 — DECLARE  { LABEL index; }
  522 — CODING   { index==0bx[4]}
  523 — SYNTAX   { "R" index }
  525 — EXPRESSION { R[index]}}
}
```

FIGURE 5

INSTRUCTION-SET ARCHITECTURE SIMULATION TECHNIQUES USING JUST IN TIME COMPILATION

CROSS-REFERENCE TO RELATED APPLICATIONS

This is a continuation of U.S. Pat. No. 8,086,438 issued Dec. 27, 2011, and claims the benefit of U.S. Provisional Patent Application No. 60/368,439 filed Mar. 27, 2002, which are both incorporated herein by reference.

BACKGROUND OF THE INVENTION

Instruction-set simulators are an integral part of a today's processor and software design process. Their important role within architecture exploration, early system verification, and pre-silicon software development phase is indisputable. The performance of the simulator is a key factor for the overall design efficiency. The flexibility and accuracy of the simulator are also key factors. One conventional instruction-set simulation technique is an interpretive technique, which is flexible but slow. A second conventional instruction-set simulation technique is a compiled technique, which is faster than interpretive simulation but lacks flexibility.

FIG. 1 illustrates an exemplary interpretive simulation workflow 150. An interpretive simulator is basically a virtual machine implemented in software, which interprets loaded object code to perform appropriate actions on a host to simulate actions of target hardware. First, the application 145 to be simulated is loaded into memory on the host computing device. In a similar fashion to the operation of the target hardware, an instruction word 152 is fetched from the program memory 154, decoded 160, and executed 170 at run-time (simulation loop), which enables the highest degree of simulation accuracy and flexibility. However, the straight-forward mapping of the hardware behavior to a software simulator has major disadvantages. Unlike in real hardware, instruction decoding is a very time consuming process in a software simulator, especially for today's VLIW architectures. Further, the growing complexity of new programmable architectures is making interpretive simulators more and more impractical.

Another conventional approach to instruction-set simulation is compiled simulation. Referring now to FIG. 2, the objective of compiled simulation 200 is to improve the simulation performance. Shifting time-consuming operations from the simulator run-time into an additional step before the simulation (compile-time) can make run-time simulation far more efficient than interpretive simulation. This step is performed by a tool called a simulation compiler 205, which compiles an application 145 to produce a compiled simulation 200. At run-time, the various instruction behaviors 220 are executed 225 on the host computer system.

Depending on architectural and application characteristics, the degree of compilation varies. All known compiled simulators have in common that a given application 145 is decoded at compile-time. Based on the results of the decoding phase, the simulation compiler 205 subsequently selects and sequences the appropriate host operations that are required to simulate the application 145. All known compiled simulators rely on the assumptions that the complete application 145 is known before the simulation starts and is also run-time static.

Thus, compiled simulation typically is far more efficient than interpreted simulation. However, a major restriction for the utilization of compiled simulators is the requirement for static program code. This limits the compiled technique to simulating a small class of applications. In contrast to typical DSP applications, which are signal-processing algorithms, micro-controller architectures usually run an operating system (OS). A significant characteristic of operating systems, run-time dynamic program code, conflicts with the limitation of compiled simulators. However, even for DSP architectures, real-time operating systems are increasingly gaining importance. Consequently, the class of devices for which conventional compiled simulation is suitable may be shrinking.

Thus, the integration of compiled simulators into embedded system design environments is not possible, since the prime requirement, predictable program code, is not fulfilled when using external program memories. Furthermore, applications with run-time dynamic program code, as provided by operating systems (OS), cannot be addressed by compiled simulators. However, today's embedded systems consist of multiple processor cores and peripherals, which make an underlying OS indispensable. Consequently, compiled simulators only allow the isolated simulation of applications, which is not sufficient for the verification of a complete hardware/software system.

Another area that is unsuitable for compiled simulators is multiple instruction-set architectures. Considering novel architectural features, especially in the domain of low power architectures, multiple instruction-sets are widely used to reduce power and memory consumption. These architectures can switch to a compressed instruction-set at run-time. For instance, the ARM core family provides a so-called "thumb" instruction-set. This dynamic instruction-set switching cannot be considered by a compiled simulator, since the selection depends on run-time values and is not predictable.

Still another area that is unsuitable for compiled simulators are large applications. This is because compiled simulation of large applications requires an enormous amount of memory, for example, 1000 times the requirements of an interpretive simulator, depending on the architecture. As long as the host memory is big enough, the high memory consumption may not have a severe impact on performance. However, for multi-processor simulation of embedded systems or processor arrays, the memory efficiency of the simulator becomes increasingly important.

Summarizing the above arguments, the enormous performance gain of compiled simulators succumbs to their restrictiveness. This implies that most application areas are still dominated by the slow interpretive technique. However, the ever-increasing complexity of applications, architectures, and systems requires higher performance.

Following is a brief discussion of some specific conventional techniques for implementing simulators and their limitations. One technique is based on the EXPRESSION language (see e.g., A. Halambi, P. Grun, V. Ganesh, A. Khare, N. Dutt, and A. Nicolau, "EXPRESSION: A Language for Architecture Exploration through Compiler/Simulator Retargetability", Proceedings of the Conference on Design, Automation & Test in Europe, 1999). This conventional simulator provides for a retargetable tool suite and allows cycle-true and bit-true modeling of pipelined processors. The technique may be suitable for modeling architectures such as the Motorola DSP 56k or Texas Instruments TMS320C6000™. However, this simulator is interpreted and hence has poor performance.

Another simulation technique is the EMBRA project, which is a compiled simulator (see, e.g., E. Witchel and M. Rosenblum, "Embra: Fast and Flexible Machine Simulation", Proceedings of the Conference on Measurement and Modeling of Computer Systems, 1996). EMBRA maps instructions from the device to be simulated to instructions on the host machine and may provide a high performance simulator for the MIPS R3000/R4000 processor. However, this simulator is non-retargetable and restricted to the target device being a MIPS R3000/R4000 architecture and the host device being a Solaris™ machine.

Another conventional technique for a compiled simulator is retargetable, but is unable to simulate run-time dynamic code. The simulator generated from a FACILE description utilizes a fast forwarding technique to achieve reasonably high performance (see, e.g., E. Schnarr, M. D. Hill, and J. R. Larus, "Facile: A Language and Compiler For High-Performance Processor Simulators", Proceedings of the International Conference on Programming Language Design and Implementation, 1998). Fast forwarding is similar to compiled simulation and uses result caching of processor actions, indexed by a processor configuration code. Previously cached actions can be replayed directly in a repeated occurrence of a configuration. However, due to the assumption that program code is run-time static, dynamic program code cannot be simulated with this technique.

Retargetable compiled simulators based on an architecture description languages have been developed within the SimnML (FSim), ISDL (XSSIM, and MIMOLA projects. (See e.g., M. Hartoog, J. A. Rowson, P. D. Reddy, S. Desai, D. D. Dunlop, E. A. Harcourt and N. Khullar, "Generation of Software Tools from Processor Descriptions for Hardware/Software Codesign", Proceedings of the Design Automation Conference, 1997; G. Hadjiyiannis, S. Hanono, and S. Devadas, "ISDL: An Instruction Set Description Language for Retargetability", Proceedings of the Design Automation Conference, 1997; and R. Leupers, J. Elste, and B. Landwehr, "Generation of Interpretive and Compiled Instruction Set Simulators", Proceedings of the Asia South Pacific Design Automation Conference, 1999.) However, due to the simplicity of the underlying instruction sequencer, it is not possible to realize processor models with more complex pipeline control mechanisms like Texas Instruments TMS3206000™ at a cycle accurate level with these techniques.

A further retargetable approach is based on machine descriptions in ANSI C. (See, e.g., F. Engel, J. Nuhrenberg, and G. P. Fettweis, "A Generic Tool Set for Application Specific Processor Architectures", Proceedings of the International Workshop on HW/SW Codesign, 1999). However, only results for a single proprietary DSP architecture are available so far. Moreover, all of the presented compiled simulation approaches are qualified by the limitations that result from the compiled principle as discussed above.

Therefore, it would be advantageous to provide a method and system for a simulator that combines retargetability, flexibility, and high simulation performance at the same time. It would be further advantageous to provide a method and system for a simulator that is suitable for run-time dynamic code. It would be still further advantageous to provide a method and system for a simulator that allows cycle-true modeling and bit-true modeling.

SUMMARY OF THE INVENTION

The present technology may best be understood by referring to the following description and accompanying drawings that are used to illustrate embodiments of the present technology which relate to the field of software tool simulators for integrated circuit devices. Specifically, embodiments of the present technology relate to a method and system for instruction-set architecture simulation using just-in-time cache-compilation.

Embodiments of the present invention provide a method and system for a simulator that combines retargetability, flexibility, and high simulation performance at the same time. Embodiments of the present invention handle run-time dynamic code. Embodiments of the present invention allow cycle-true modeling and bit-true modeling. Embodiments of the present invention provide these advantages and others not specifically mentioned above but described in the sections to follow.

A method of simulating a program is disclosed. The method may combine compiled and interpretive techniques into a just-in-time cached compiled technique. When an instruction of a program simulation is to be executed at run-time, a table of compiled instructions is accessed to determine whether compiled data for the instruction is stored in the table. If the compiled data is not therein, the instruction is compiled and the results are stored in the table. Then, the compiled data or a table reference thereto is returned to a simulator that is executing the program simulation. Thus, if the instruction is not already compiled, it is compiled just in time. By storing the compiled data in the table, it need not be compiled again if the instruction is re-executed. As many instructions, such as those in loops, are repeatedly executed, the performance of this simulation technique is very efficient.

Another embodiment of the present invention protects from overwriting information for simulating an instruction in the event it is currently active. For example, this may be used to prevent instructions in a pipeline from being removed from the table before they get through the pipeline. When an instruction of a program simulation is to be executed by a simulator at run-time, it is determined whether a table contains information to simulate the instruction. If not, the information to be used to simulate the instruction is determined. Before storing the new information in the table, another table may be consulted to determine if the location to which the new information is to be stored is protected. If the table location is protected, the new information is not stored in the table. Rather, the new information is simply passed on to the simulator running the program simulation. Thus, it may be stated that the instruction is interpreted rather than compiled in this case. If the table location is not protected, the new information is stored in the table and made available to the simulator.

Another embodiment of the present invention protects from overwriting information for simulating an instruction in the event it is currently active. For example, this may be used to prevent instructions in a pipeline from being removed from the table before they get through the pipeline. When an instruction of a program simulation is to be executed by a simulator at run-time, it is determined whether a table contains information to simulate the instruction. If not, the information to be used to simulate the instruction is determined. Before storing the new information in the table, another table may be consulted to determine if the location to which the new information is to be stored is protected. If the table location is protected, the new information is not stored in the table. Rather, the new information is simply passed on to the simulator running the program simulation. Thus, it may be stated that the instruction is interpreted rather than compiled in this case. If the table location is not protected, the new information is stored in the table and made available to the simulator.

In another embodiment, the above computer system further comprises a protection table for indicating whether locations in the cache table are protected from being overwritten.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which:

FIG. 5 illustrates an exemplary LISA processor description for a processor ADD instruction that may be used in the implementation of embodiments of the present invention.

DETAILED DESCRIPTION OF THE INVENTION

Figure 1:
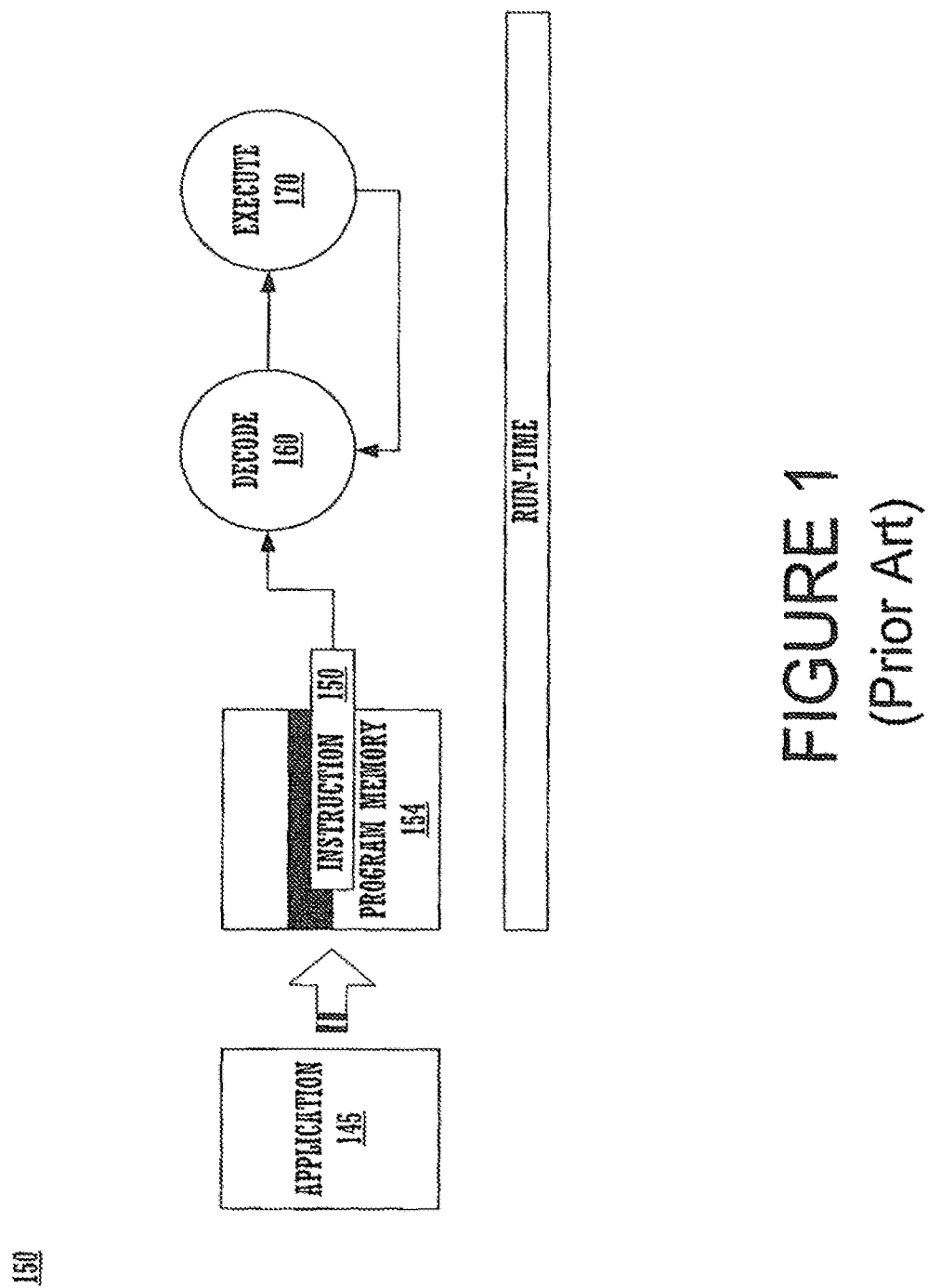
FIG. 1 is a diagram illustrating a conventional interpretive simulation workflow.
Figure 2:
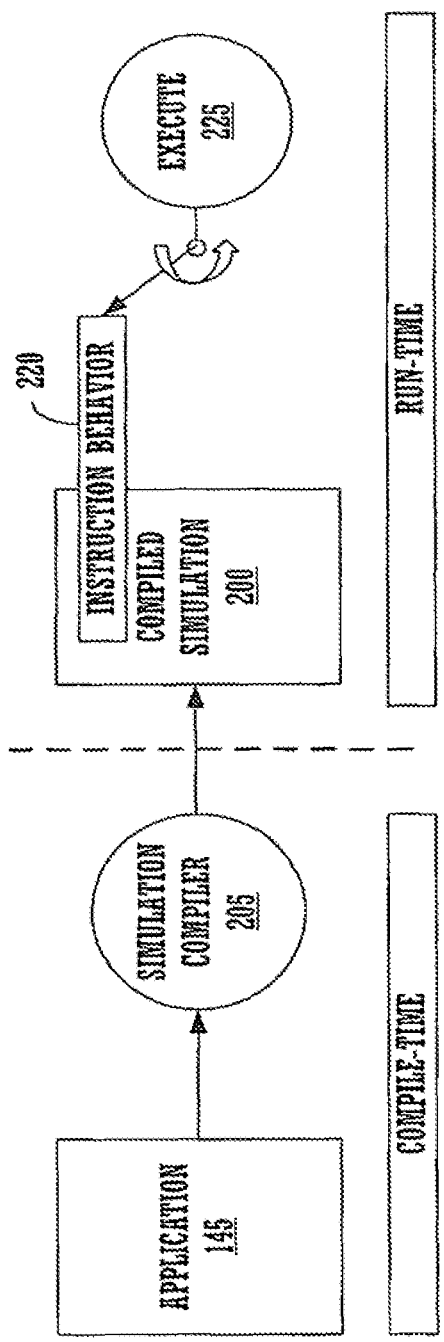
FIG. 2 is a diagram illustrating a conventional compiled simulation workflow.

In the following detailed description of embodiments of the present invention, a method and system for instruction-set architecture simulation using just-in-time cache-compilation, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "annotating" or "mapping" or "processing" or "computing" or "translating" or "calculating" or "determining" or "compiling" or "returning" or "storing" or "decoding" or "invoking" or "simulating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention provide a JIT-CC™ (just-in-time cache-compiled) simulator. Embodiments provide a retargetable simulation technique, which may combine the performance of traditional compiled simulators with the flexibility of interpretive simulation. This technique is not limited to any class of architectures or applications and can be utilized from architecture exploration up to end-user software development.

Embodiments of the present invention may integrate the simulation compiler into the simulator. The compilation of an instruction may take place at simulator run-time, just-in-time before the instruction is going to be executed. Subsequently, the extracted information may be stored in a simulation cache for the direct reuse in a repeated execution of the program address. The simulator may recognize if the program code of a previously executed address has changed and initiate a re-compilation. Thus, embodiments of the present invention offer the full flexibility of a conventional interpretive technique, while maintaining the performance of a conventional compiled simulation.

Figure 3:
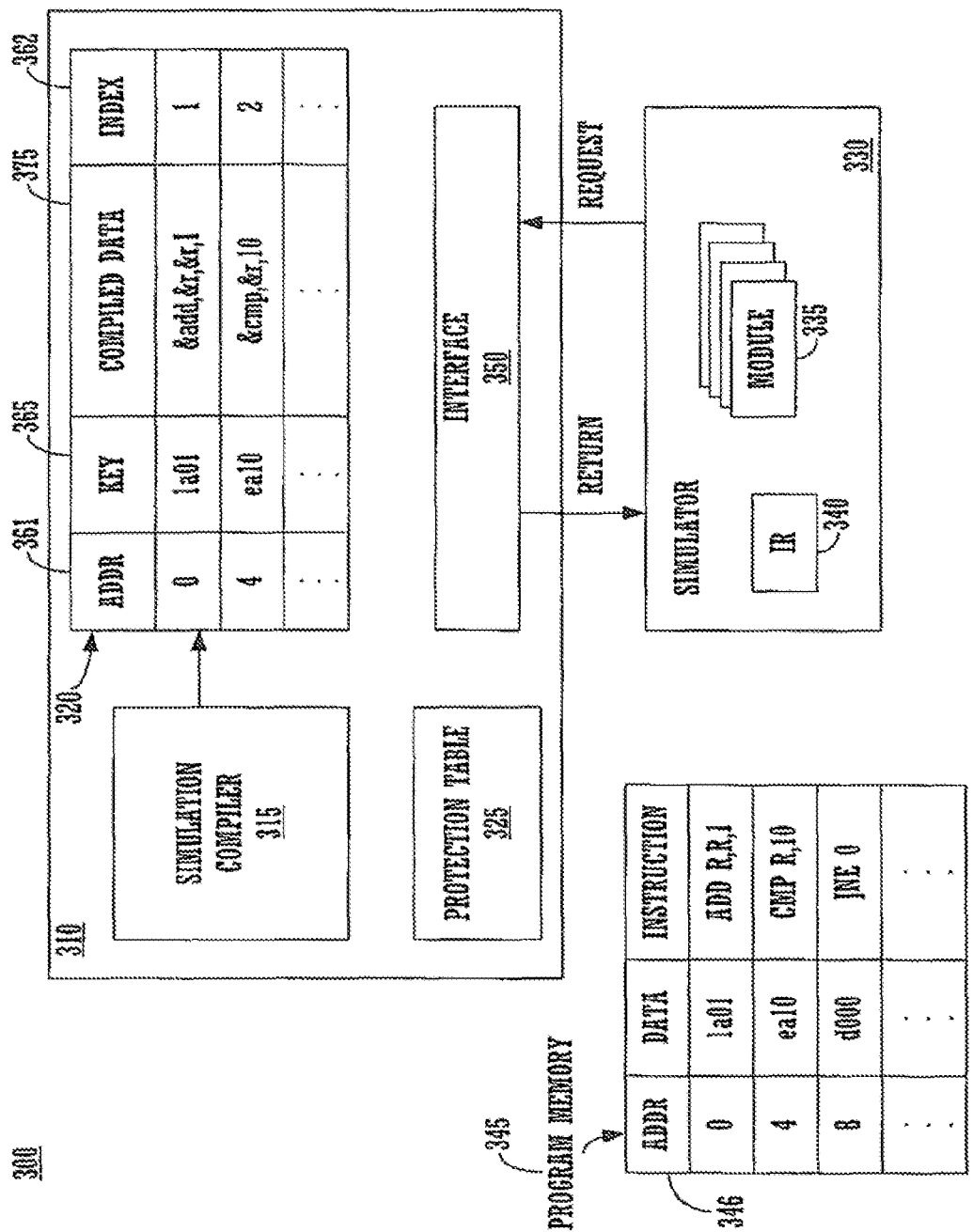
FIG. 3 is a diagram of a system for simulating a program, according to an embodiment of the present invention.

FIG. 3 illustrates software architecture for a system 300 for simulating a program, according to an embodiment of the present invention. The system 300 may be used for simulation of an instruction-set architecture. The system 300 may be implemented within a host computing device, such as computer system 100 depicted in FIG. 9. Embodiments of the present invention are not limited to any particular host device, unlike some conventional techniques. The system 300 has a just-in-time compilation unit 310 for compiling or decoding instructions as they are needed, if they are not already compiled or decoded. The simulation compiler 315 may decode instructions to be simulated and determine operations that are suitable to simulate the instructions. The operations may be stored in a cache table 320, such that they are available if that instruction is executed again. The operations may be referred to throughout this description as compiled instructions. As most programs frequently repeat instructions, the cache table 320 may be used to alleviate the need to always decode or compile an instruction that is to be executed. For example, if the program being simulated has a loop, then the cached compiled instructions are used for all but the first execution of the loop.

The cache table 320 may comprise entries for addresses 361, keys 365, compiled data 375, and indexes 362. The cache addresses 361 may be mapped from program addresses 346 in the program memory 245. The keys 365 may be used to identify what instruction is currently held in a given entry. The compiled data 375 may be information that is suitable for the simulator 330 to used to execute the instruction. The indexes 362 may be used for indexing the cache table 320. The cache table 320 elements are discussed in more detail herein.

Embodiments of the present invention overwrite compiled instructions and other information (e.g., the key 365) in the cache table 320 under some circumstances. For example, multiple program addresses 346 may map to a single cache address 361. Also, the program may be run-time dynamic. Therefore, the cache table 320 may be altered in response to changes in the program code at given program addresses 346. However, the just-in-time compilation unit 310 has a protection table 325 for protecting certain compiled instructions in the cache table 320 from being overwritten. This may be useful to protect pipelined instructions and will be discussed in greater detail herein.

The system 300 also comprises a simulator 330. The simulator 330 may be automatically generated from a description of the hardware and software being simulated. The simulator 330 may comprise a number of modules 335, which may be used to implement portions of the instruction being simulated. In one embodiment, the compiled data 375 is made up of one or more operations and one or more parameters. An operation may then be implemented by executing its corresponding function. In one embodiment, the operations are operations in LISA (Language for Instruction-Set Architecture) and the functions are functions in the C programming language. However, embodiments of the present invention may use other languages for both the operations and the modules 335.

The modules 335 may be compiled before run-time. In this fashion, there is no need to call, for example, a C-compiler at runtime. By avoiding such a call at run-time, embodiments of the present invention provide a solution that is highly efficient. Thus, it will be understood that the compilation performed by the simulation compiler 315 of various embodiments does not mean that a C-compiler or the like is invoked. FIG. 3 also shows an instruction register (IR) 340 in the simulator 330, program memory 345 for storing instruction of the program to be simulated, and an interface 350 for the just-in-time compilation unit 310.

Figure 4:
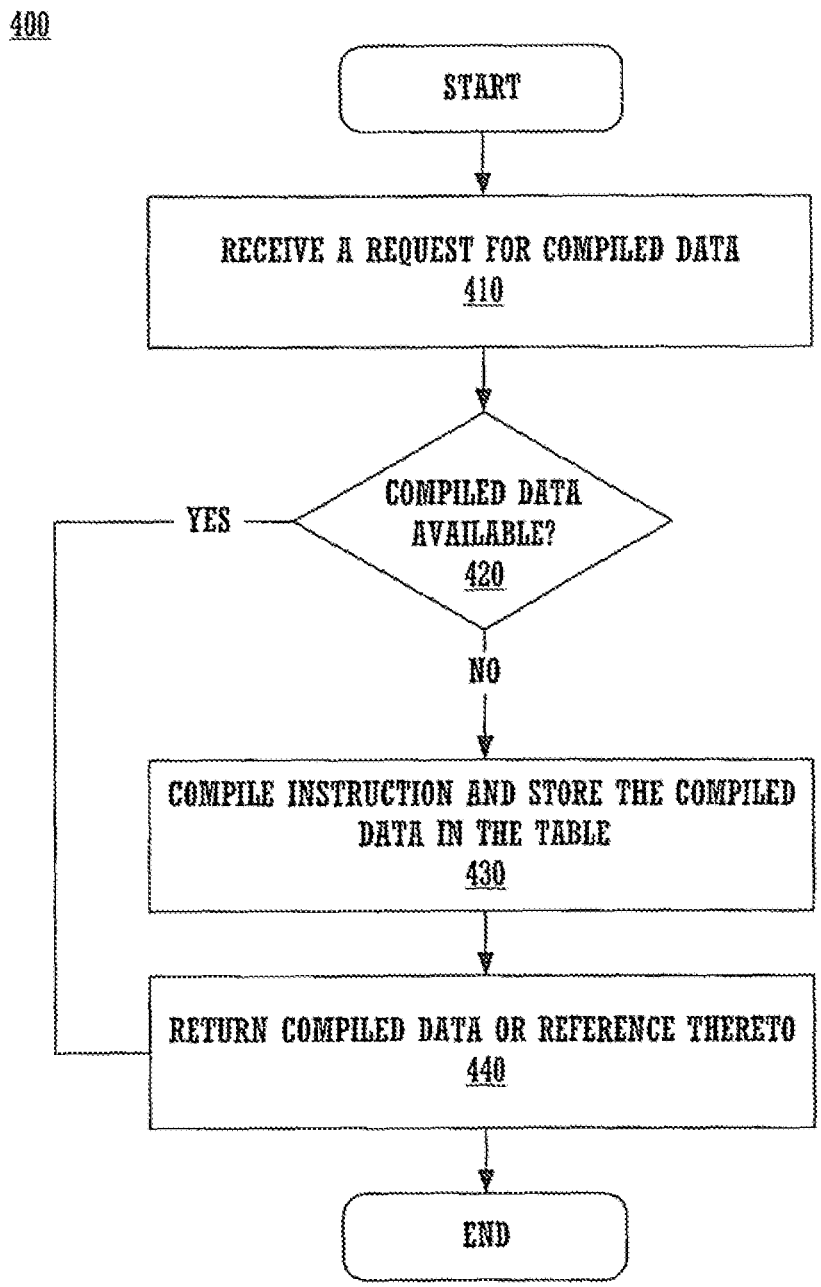
FIG. 4 is a flowchart illustrating steps of an exemplary process of simulating a program, according to an embodiment of the present invention.

Referring to FIG. 3 and to process 400 in the flowchart of FIG. 4, additional details of the just-in-time cache-compiled system 300 will be discussed. In step 410, the interface 350 receives a request for compiled data from the simulator 330. For example, if the simulator 330 is going to execute the instruction at address 4, it may request the just-in-time compilation unit 310 for compiled data 375 for that instruction. In one embodiment, the simulator 330 passes the address of the program counter to the just-in-time compilation unit 310.

In step 420, the just-in-time compilation unit 310 determines if compiled data 375 is available in the cache table 320 for the requested instruction. Thus, the just-in-time compilation unit 310 looks up the address 361 in the cache table 320 to determine whether the correct compiled data 375 is in the cache table 320. For example, it may be that the cache table 320 entry was empty or contains other information, as a single cache 320 table entry may be used for multiple program addresses 346. Moreover, embodiments of the present invention allow for run-time dynamic code. Therefore, an instruction at a given program address 346 may change during program execution.

In general, when an instruction is going to be executed, the just-in-time simulation compiler 315 may look up the cache table 320 entry that corresponds to the current program address 346. The cache table 320 may be indexed by a non-ambiguous program address 361. Before the previously cached data is used in the simulation, its validity is verified. To do this, each cache table 320 entry contains a key 365, for example, the instruction word. The key 365 is compared to the simulator's instruction register 340 contents. In some embodiments, the key 365 is made up by more than one instruction register 340. This may be the case for processors with multi-word instructions, or parallel instructions within a VLIW bundle; which may require multiple instruction registers 340 be used.

If the compiled data 375 is not available, then the instruction is compiled and stored in the cache table 320 in step 430. Thus, at address 4 in the cache table 320 the just-in-time simulation compiler 315 stores the key 365 "ea10", and the compiled data 375 "&cmp, &r, 10." It will be understood that the cache table 320 as depicted in FIG. 3 may illustrate either the case after step 430 is taken or the case when step 430 is unnecessary.

In step 440, the just-in-time compilation unit 310 returns the compiled data 375 or a reference thereto to the simulator 330. The presented workflow of the just-in-time compiled simulator 310 shows that a major disadvantage of conventional compiled simulation technique, the requirement for fixed and predictable program code, does not apply for the just-in-time compiled simulator 310. This is clear from the fact that the cache table 320 entries may be re-written and checked for validity.

In one embodiment of the present invention, the workflow of the just-in-time simulation compiler is implemented using a LISA processor model. A LISA model may be a mixed structural/behavioral description of a processor. The structural part may keep the definition of processor resources like registers, memories and pipelines. LISA operations may be used for the processor's instruction-set, including instruction-coding, assembly syntax, functional behavior, and timing. A single processor instruction can be represented by multiple LISA operations.

The following example shows an excerpt of a LISA processor description for a simple processor ADD instruction. Referring now to FIG. 5, the exemplary LISA processor description 500 contains a resource definition 510 comprising program memory 512 and register resources 514. Also included are the exemplary LISA operations of "Add" 520 and "Register" 530. Thus, the various exemplary LISA operations may be used in the simulation of a processor instruction.

Still referring to FIG. 5, the add operation 520 implements the binary coding, assembly syntax, and the functional behavior of the processor instruction ADD. The register operation 530 describes the binary coding, assembly syntax of a single register within the processor's register file. The add operation 520 and the register operation 530 each have a declare field 521, a coding field 522, and a syntax field 523. The add operation 520 has a behavior field 524 for defining a behavior of the add operation 520. The register operation 530 has an expression field 525. A reference to the respective resource is returned for the use in the functional behavior of the add operation 520. For example, the instruction-set information of the operand registers src1, src2, and dst are referenced from the inferior LISA register operation 530.

The presented structure of LISA processor models enables the following procedure. The behavioral C code of LISA operations may be pre-compiled into C-functions (e.g., modules 335 of the simulator 330). The simulation compiler 315 may select the appropriate operations, which are required to simulate an instruction, on the basis of the coding information. References to the selected C-functions may be subsequently stored in the cache table 320. These references may be utilized by the simulator 330 to execute the instructions' behavior. It will be understood that embodiments of the present invention are limited to neither LISA operations nor C-functions.

Figure 6:
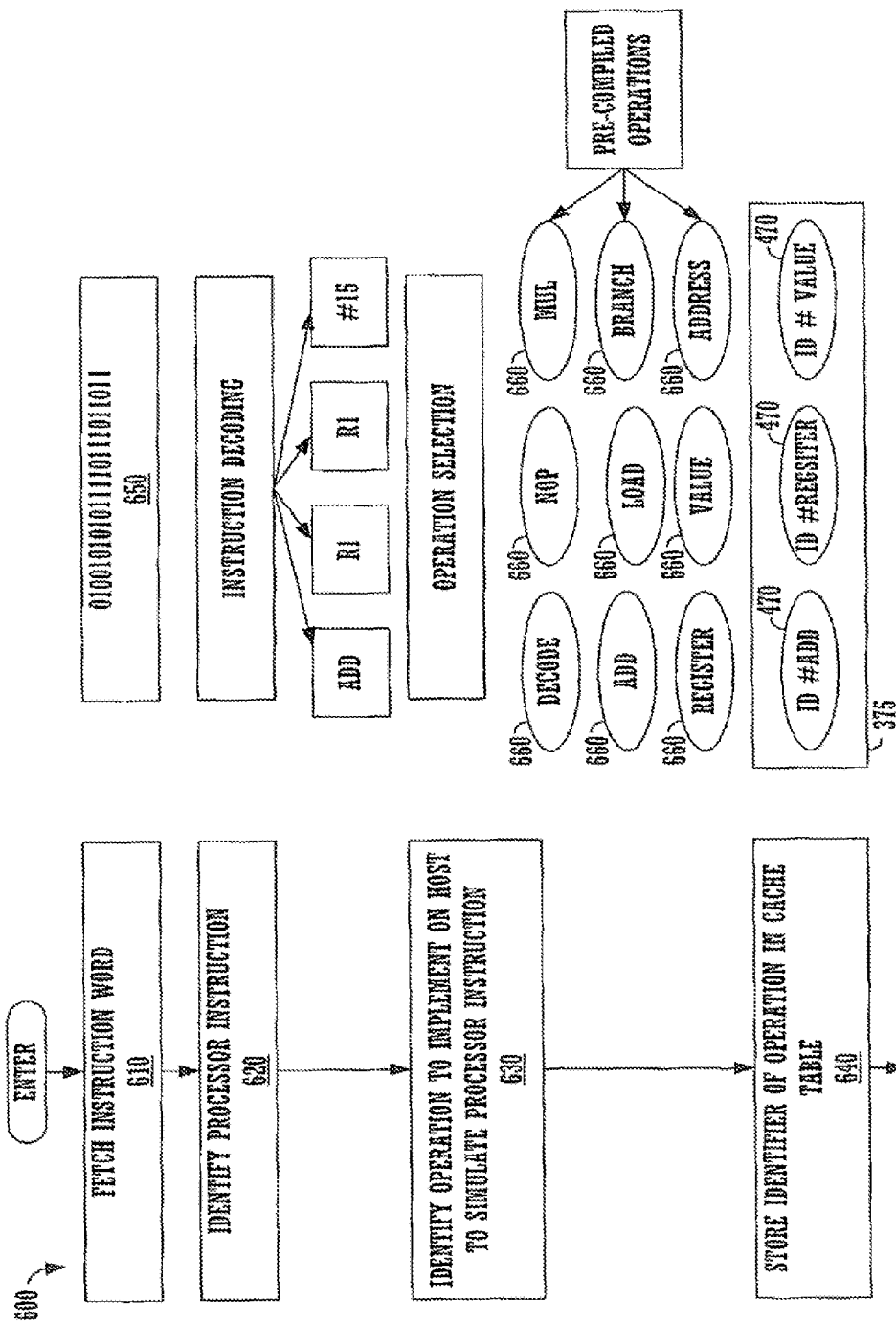
FIG. 6 is a flowchart and diagram illustrating steps of an exemplary process for just-in-time cache-compiled simulation, according to an embodiment of the present invention.

Referring now to FIG. 6, a method of compiling the instructions to be simulated on the host device will be discussed. FIG. 6 contains a flowchart and an associated diagram illustrating steps of the process 600. In step 610, an instruction 650 is fetched from program memory 345.

In step 620, the simulation compiler 315 identifies the instruction 650 and decodes it. In the example, the instruction 650 is an ADD instruction, with operands of registers R1 and R2. The value is the number "15".

In step 630, operations 660 are selected that may be used in the simulation of the instruction 650. In this case, the operations 660 of "add", "register", and "value" are selected to carry out the simulation of the instruction 650. The operations 660 may be pre-compiled and stored on the host device. In various embodiments, the simulator 330 has access to the operations 660. For example, the operations 660 may be stored as the modules 335 in FIG. 3. While the operations 660 may be LISA operations, as in FIG. 5, this is not required.

In step 640, one or more operation identifiers 470 may be stored in the cache table 320. For example, they may be stored in the compiled data 375 of the cache table 320. The operation identifiers 470 may be passed on to the simulator 330 in response to the simulator's 330 request for a decoded instruction. It will be understood that not all of the compiled data 375 need be an operation 660. For example, while in this case the value "15" is shown as an operation 660, it could also be a parameter without an associated operation 660.

Embodiments of the present invention simulate program code that is run-time dynamic. Moreover, embodiments of the present invention simulate program code that may be of very great size. For example, although the cache table 320 may be run-time static size and may be smaller than the application size, the information in the cache table 320 may be replaced. Embodiments of the present invention utilize a unique although not necessarily biunique mapping function, which describes the assignment of program memory addresses 346 to cache addresses 361 (e.g., a hash function). The cache key 365 may be employed to detect cache collisions (in addition to detected changed program code). These collisions may result from multiple program memory addresses 346 sharing a single entry in the cache table 320.

Embodiments of the present invention minimize cache administration overhead. Since the instruction compile time may define the penalty for a cache table 320 miss, the overhead for the cache table 320 administration should be significantly smaller. To fulfill this constraint, a simple one-level cache table 320 with a direct address mapping may be used. Each program memory address 346 may correspond to one cache table address 361. When a cache table 320 collision occurs, the respective entry may be directly overwritten by the new instruction. The direct address mapping assures a minimum cache table 320 miss rate for spatially coherent code. Loops, the time critical parts of a program, directly benefit from this characteristic if the loop kernel fits into the cache. The cache table 320 may easily be made large enough to fit most loop kernels most of the time.

In some embodiments of the present invention, each cache table address 361 may be overwritten directly in a following simulator 330 control step. This may work well for instruction accurate simulators where a complete instruction is processed within each control step. However, this assumption may not be maintainable in case of cycle based simulation of pipelined architectures because the lifetime of an instruction within the pipeline is not predictable. Therefore, in some embodiments of the present invention, cache table 320 entries of instructions currently processed in the pipeline may be protected against being overwritten. This may be achieved by maintaining a protection table 325 that keeps the instruction addresses that are currently in use. Since the number of (VLIW) instructions present in the pipeline at the same time cannot exceed the number of pipeline stages, the size of the protection table 325 may be defined by the number of stages.

Concerning the cache table 320 access, three cases may be considered: a cache table 320 hit, a cache table 320 miss with cache address 361 not in use, and a cache table 320 miss with cache address 361 in use. In case of a cache table 320 hit, the compiled data 375 for the instruction can be taken directly from the cache table 320.

In the second case, the instruction is not present in the cache table 320, but the corresponding cache table 320 entry may be overwritten with the recently compiled data 375. Furthermore, the instruction address may be registered in the protection table 325. Cache table 320 entries may be written in a circular manner to displace instructions that have already left the pipeline.

In the third case, a cache table 320 miss occurs and it is determined that the cached instruction which is to be replaced still remains in the pipeline. This case may arise in very rare circumstances. In this case, the simulator 330 may switch to interpretive mode for the particular instruction.

Figure 7:
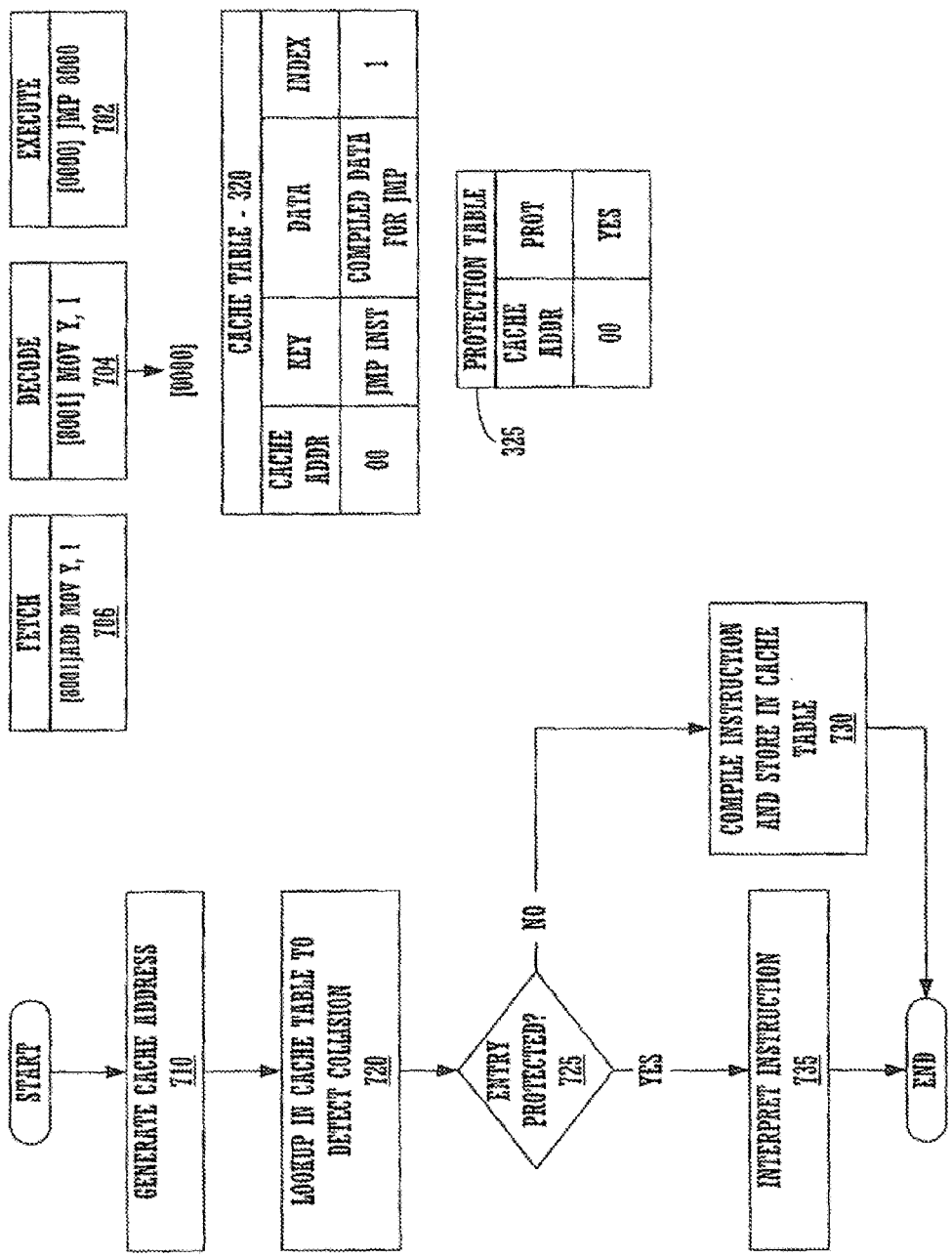
FIG. 7 is a flowchart and diagram illustrating steps of an exemplary process of protecting instructions in a cache from being overwritten, according to an embodiment of the present invention.

The flowchart and diagram of FIG. 7 illustrate an interpretive mode of an embodiment that may be used to protect instructions from being overwritten. The upper right of FIG. 7 shows three instructions in the pipeline: a JMP instruction 702 being executed, a MOV instruction 704 being decoded, and an ADD instruction 706 being fetched. In step 710, the cache address 361 for the MOV instruction 704 is generated, producing the address "00". At this time the cache table 320 has the decoded information for a IMP instruction 702 at address "0000".

In step 720, the entry for address "8000" is looked up in the cache table 320. A cache collision is detected because the cache table entry still has the JMP instruction 702 from address "0000."

Before the entry at "00" may be overwritten, the pipeline-protection table 325 may be checked to determine whether the JMP instruction 702 is still in use or not. In step 725, a determination is made as to whether the decoded information from the MOV instruction may be stored in the cache table 320. In other words, is the entry at address "00" protected?

If the JMP instruction 702 is not protected, then step 730 is taken, in which the JMP instruction 702 in the cache table 320 may be overwritten. It may be stated that the MOV instruction 704 is compiled, in this case. In the exemplary protection table 325 of FIG. 7, the JMP instruction 702 is protected and hence may not be overwritten.

Thus, if the JMP instruction 702 is still in use, the JMP instruction 702 is not overwritten. In this case, step 735 is taken in which the MOV instruction 704 is not stored in the cache table 320 (e.g., it is not cache compiled). Instead it is interpreted, without updating the cache table 320. For example, the simulation compiler 315 may decode the instruction and determine which operations 660 are suitable to simulate the MOV instruction 704. This information is then made available to the simulator 330 without storing the information in the cache table 320.

Embodiments of the present invention are not limited to direct mapping of program addresses 346 to cache addresses 361. For example, a set-associative cache may be used. Those of ordinary skill in the art will understand that other mapping strategies may be used as well.

EXEMPLARY RESULTS

The following summarizes results achievable with just-in-time cache compiled simulator of embodiments of the present invention. The total compiled simulation time $t_{app,cs}$ is equivalent to the total instruction execution time $t_{ex,total}$, which is the product of the instruction execution count $n_{exec}$ and the average execution time per instruction $t_{ex,insn}$. For the just-in-time compiled simulation the total simulation time $t_{app,js}$ is additionally made up by the total compilation time $t_{comp,total}$. Under the assumption that the program code is constant, the total compilation time only depends on the instruction count of the application $n_{insn}$ and the average time for compiling a single instruction $t_{comp,insn}$. The following equations summarize the above.

$$t_{app,cs} = t_{ex,total} \quad \text{Equation (1)}$$

$$t_{app,js} = t_{ex,total} + t_{comp,total} \quad \text{Equation (2)}$$

$$t_{ex,total} = t_{ex,insn} * n_{exec} \quad \text{Equation (3)}$$

$$t_{comp,total} = t_{comp,insn} * n_{insn} \quad \text{Equation (4)}$$

Based on the equations (1) and (2) the instruction throughput of conventional compiled simulation $p_{cs}$ and just-in-time cache compiled simulation $p_{js}$ of embodiments of the present invention can be deduced. Equations 5 and 6 define the relationships.

$$p_{cs} = 1/t_{ex,insn} \quad \text{Equation (5)}$$

$$p_{js} = 1/(t_{ex,insn} + t_{comp,total}/n_{exec}) \quad \text{Equation (6)}$$

Equation 7 shows that for a growing number of instruction executions, the performance of the just-in-time compiled simulator converges to the performance of a conventional compiled simulator.

$$\lim_{n_{exec} \to \infty} p_{js} = p_{cs} \quad \text{Equation 7}$$

Figure 8A:
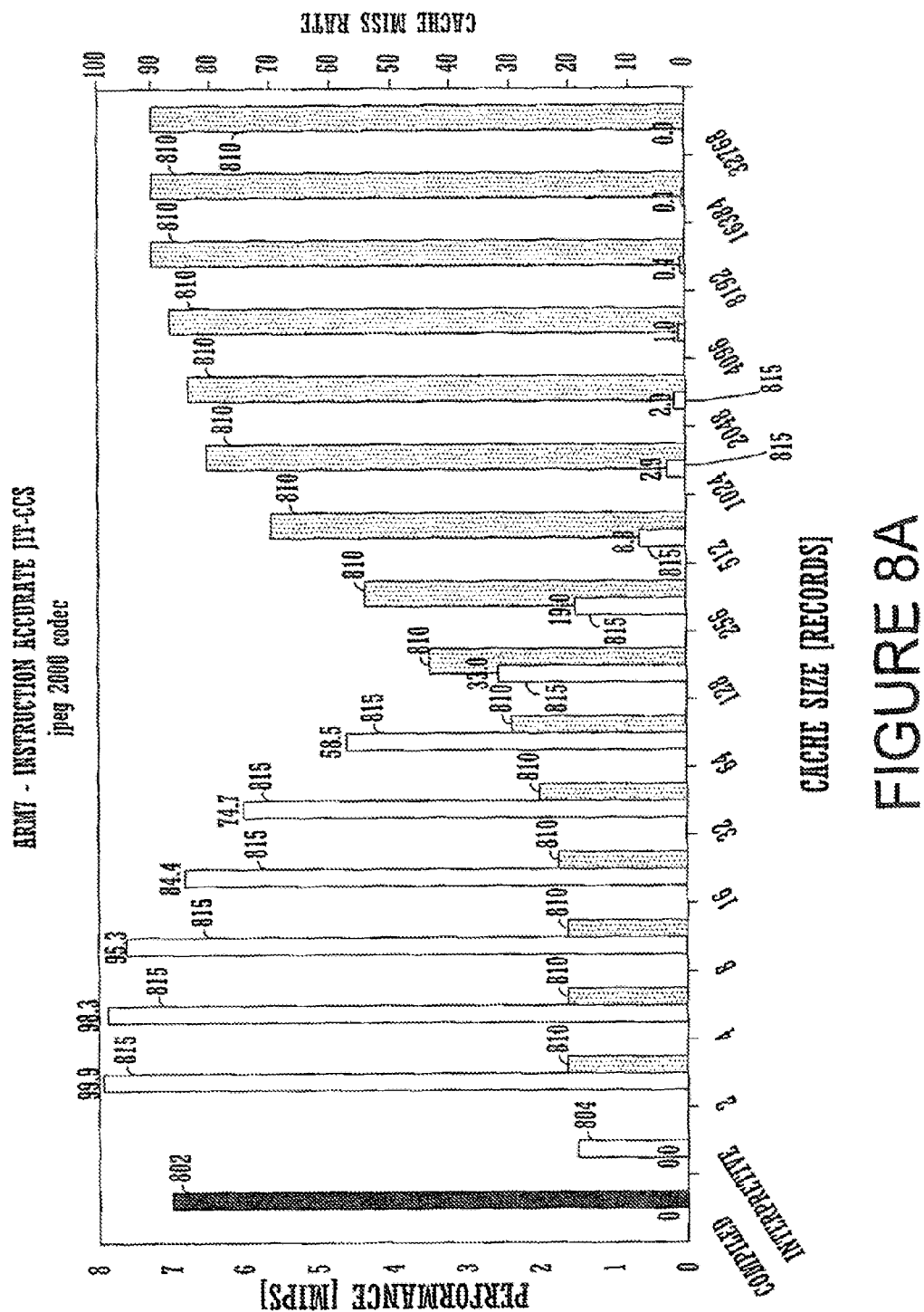
FIG. 8A, FIG. 8B, and FIG. 8C are graphs illustrating performance results that may be achieved with various cache sizes, according to embodiments of the present invention.
Figure 8B:
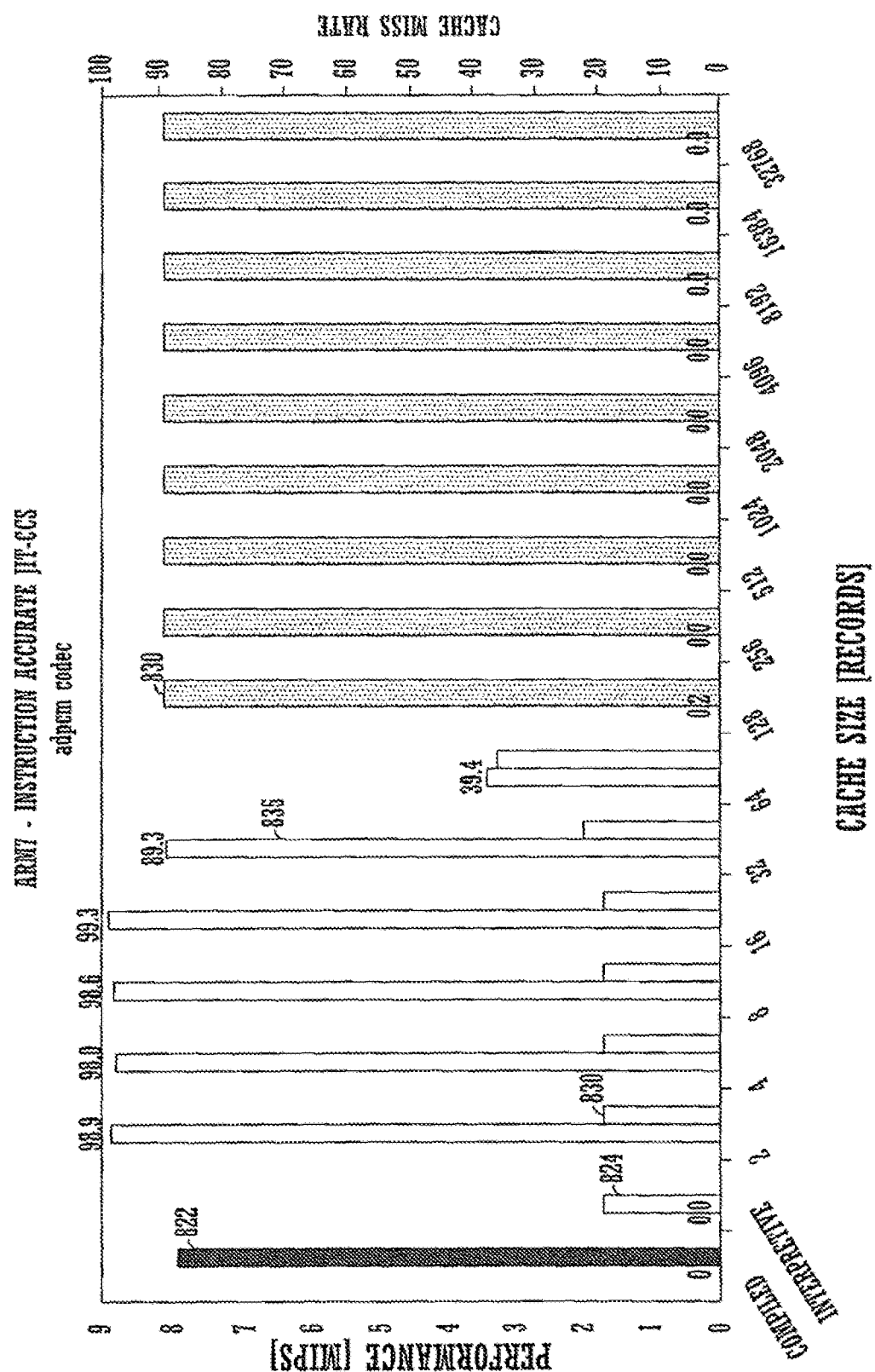
Figure 8C:
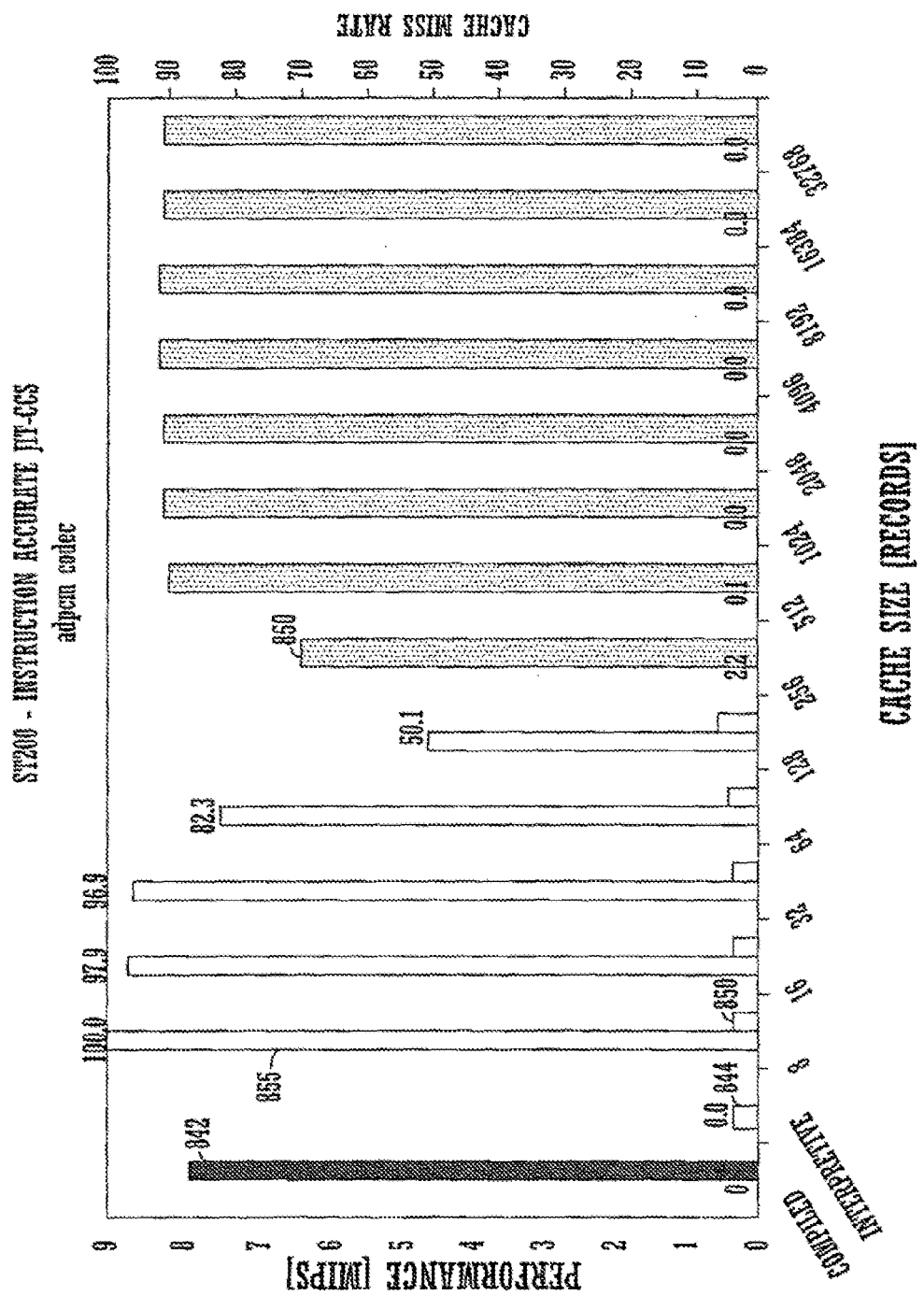

The number of repeatedly executed instructions needed for a good convergence of the simulation speed very well corresponds to the conditions provided by real-world applications. This is due to the fact that most programs behave according to the 90/10 rule: 90% of execution time is spent in 10% of the code. For instance, the proportion $n_{exec} = n_{insn} = 256$ corresponds to a loop that is iterated 256 times. Together with the valid assumption that $t_{comp,insn} = 4*t_{ex,insn}$, 98.5% of the compiled simulation performance is achieved. FIG. 8A-8C illustrate real-world results verifying the above.

The following illustrate results of the applicability and efficiency of the retargetable just-in-time cache compiled simulation technique for various LISA processor models. In particular, simulation results of the Advanced RISC Machines, ARM7, and ST Microelectronics™ ST200 LISA models are presented. The processor models have been verified accurately against the vendor tools. Herein, the instruction throughput of embodiments of the present invention is compared to the performance of conventional interpretive and compiled techniques (both generated from LISA 2.0 descriptions). Therefore, the applications that have been selected for the benchmark fulfill the requirements of the conventional compiled simulation technique: constant program code.

Furthermore, the influence of cache table 320 size on performance of various embodiments is presented. Performance results of the different generated simulators were obtained using a 1200 MHz Athlon™ PC, 768 MB RAM running Microsoft Windows 2000™ operating system. The generated simulator code has been compiled using a Microsoft Visual C++™ 6.0 compiler with optimizations turned on (/O2).

FIG. 8A illustrates benchmark results of instruction accurate simulators for the ARM7 running a jpeg2000 codec. The two leftmost bars 802, 804 show the performance in MIPS (million instructions per second) of conventional compiled and interpretive simulation techniques, respectively. Also shown is the performance for embodiments of the present invention with different cache table 320 sizes. For each cache-size value on the x-axis, there are two bars. One is the performance 810 in MIPS for that cache table 320 size. The other is the relative cache table 320 miss rate 815.

Still referring to FIG. 8A, simulation performance improves with a growing cache table 320 size. This effect becomes clear when looking at the continuously decreasing cache table 320 miss rate. Examining the results, it can be seen that more than 95% of the compiled simulation performance is achieved with a 4096 entry size cache table 320. This cache table 320 allocates less than 2 MB of host memory, assuming about 512 bytes per cache table 320 entry. Compared to a conventional compiled simulator, which requires approximately 23 MB for all 47,354 instructions of the application, embodiments of the present invention are very memory efficient.

In contrast to conventional compiled simulators, embodiments of the present invention are characterized by a user defined performance versus memory trade-off. Due to the execution locality of programs, embodiments of the present invention achieve performance saturation rapidly, resulting in manageable small cache table 320. Unlike the voluminous jpeg 2000 codec with large (e.g., greater than 1024 instruction) loop kernels, typical DSP applications like the adpcm codec require much smaller caches. The biggest loop of the adpcm codec compiled for the ARM7 spans 122 instructions.

The benchmark results for the adpcm codec presented in FIG. 8B reflect this characteristic. In particular, for each cache table 320 size on the x-axis, results are shown for the performance 830 in MIPS and the cache table 320 miss ratio 835, for various embodiments of the present invention. Here a cache table 320 size of 128 entries is sufficient to achieve 95% of the conventional compiled simulation performance 822. The investigation of further applications has shown, that a reasonably big cache table 320 size (approx. 4096-16384) is sufficient for a >95% approximation of the conventional compiled performance 822. FIG. 8B also shows conventional interpretive performance 824.

Referring now to FIG. 8C, simulation results of an adpcm codec will be discussed. Again, for each x-axis cache table 320 size, results are displayed for performance 850 in MIPS and cache table 320 miss ration 855, for various embodiments of the present invention. The conventional interpretive result bar 844 (second bar from the left) reveals that compared to the ARM7 benchmark results of FIG. 8A-8B, the conventional interpretive simulator performs very poorly. This may be due to the complex instruction decoder, which may also influence the performance of embodiments of the present invention for small cache tables 320. Also shown are conventional compiled performance results 842 in MIPS.

Still referring to FIG. 8C, the ST200 processor is a VLIW architecture with many possible parallel instruction combinations. The 128-bit instruction word (VLIW) allows multiple combinations of parallel instructions with and without extensions for immediate values. Together with distributed op-codes the instruction decoding process of the software simulator dominates the actual behavioral execution. Here, a cache table 320 size of at least four entries is required to store the parallel instructions of the VLIW instruction word.

The results in FIGS. 8A-8C illustrate that when the cache table 320 is of even a moderate size (e.g., 512 records), the performance of embodiments of the present invention rival that of conventional compiled simulators. For larger cache table 320 sizes, the performance results are almost identical.

Figure 9:
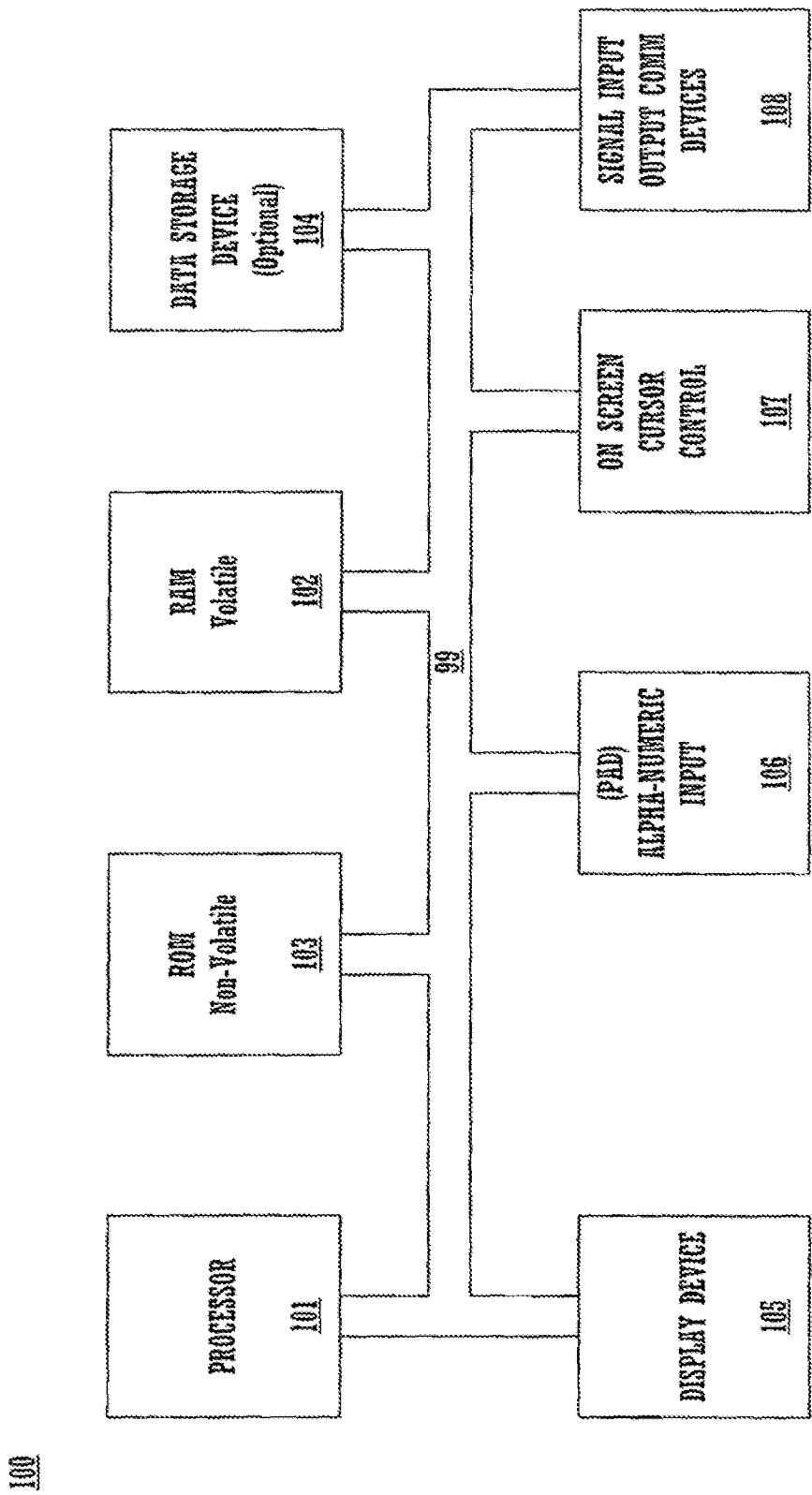
FIG. 9 is an exemplary computer system that may serve as a platform upon which embodiments of the present invention may be executed.

FIG. 9 illustrates circuitry of an exemplary computer system 100, which may form a platform for embodiments of instruction-set architecture simulation using just-in-time cache-compilation. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 9, system 100 also includes an optional alphanumeric input device 106 including alphanumeric and function keys coupled to bus 99 for communicating information and command selections to central processor unit 101. System 100 also includes a cursor control device 107 coupled to bus 99 for communicating user input information and command selections to central processor unit 101. System 100 of the present embodiment also includes a display device 105 coupled to bus 99 for displaying information. A signal input/output communication device 108 coupled to bus 99 provides communication with external devices.

The preferred embodiment of the present invention, a method and system for instruction-set architecture simulation using just-in-time cache-compilation, is thus described. The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of simulating a program comprising:
    determining if compiled data is stored at an address in a memory table, in response to a request from a simulator at run-time for compiled data of a given instruction;
    compiling said given instruction and storing said given compiled data of said given instruction at said address in said memory table, if said compiled data is not stored at said location in said memory table;
    determine if said given instruction, has changed from a previous execution of an instruction having compiled data at said address in said memory table, if said compiled data is stored in said location in said memory table;
    re-compiling said given instruction to generate compiled data of said given instruction and storing said compiled data of said given instruction at said location in said memory table, if said given instruction has changed from said previous execution of said instruction having compiled data at said address in said memory table and if said address in said memory table is not protected from being overwritten, wherein said compiled instructions in said memory table are individually protected or unprotected from being overwritten; and
    returning said compiled data of said given instruction or a reference thereto to said simulator.

2. A method comprising:
    receiving, by an interface from a program simulator, a request for compiled data of a given instruction;
    accessing, by said interface, a protection table, stored in memory, that indicates whether locations in a cache table are individually protected or unprotected from being overwritten for each of a plurality of instructions in said cache table;
    accessing, by said interface, said cache table of compiled data, stored in said memory;
    compiling, by an instruction compiler, said given instruction and storing compiled data relating to said given instruction at a given location in said cache table, if compiled data is not stored at said given location in said cache table;
    verifying, by said interface, that said compiled data at said given location in said cache table is related to said given instruction, and not a different instruction that was previously executed at a same instruction address as the given instruction, if compiled data is stored at said given location in said cache table;
    compiling, by said instruction compiler, said given instruction to produce said compiled data relating to said given instruction, if said compiled data at said given location in said cache table is not related to said given instruction;
    storing, by said interface, said compiled data relating to said given instruction or a reference thereto at said given location in said cache table, if said protection table indicates that compiled data of said different instruction at said given location is not protected from being overwritten; and
    returning, by said interface to said program simulator, said compiled data relating to said given instruction or said reference thereto.

3. A non-transitory computer readable medium having stored therein instructions which when executed on a processor implement a simulator comprising:
    determining if compiled data for a given instruction is stored in a data structure of compiled instructions, wherein compiled instructions are individually selectively protected from being overwritten;
    decoding said given instruction, determining said compiled data for said decoded given instruction, and storing said compiled data in said data structure, if said compiled data is not in said data structure;
    determining if said given instruction has changed from a previous execution of an instruction having compiled data in said data structure;
    decoding said given instruction and determining said compiled data for said decoded given instruction, if said given instruction has changed from said previous execution of said instruction having compiled data in said data structure, determining if said compiled data in said data structure from a previous execution is protected, storing said compiled data for said decoded given instruction in said data structure if said compiled data in said data structure from a pervious execution is not protected, and not storing said compiled data for said decoded given instruction in said data structure if said compiled data in said data structure from a previous execution is protected; and returning said compiled data.

4. The non-transitory computer readable medium having stored therein instructions which when executed on a processor implement the simulator according to claim 3, where reuniting said compiled data comprises returning a reference to said compiled data to a program simulation.

5. The non-transitory computer readable medium having stored therein instructions which when executed on a processor implement the simulator according to claim 3, further comprising:

identifying one or more operations to he used to simulate said given instruction, if said compiled data is not in said data structure; and decoding said given instruction into one or more parameters, if said compiled data is not in said data structure.

6. The non-transitory computer readable medium having stored therein instructions which when executed on a processor implement the simulator according to claim 5, where returning said compiled data comprises invoking a function call to implement one of said operations.

7. The non-transitory computer readable medium having stored therein instructions which when executed on a processor implement the simulator according to claim 3, further comprising decoding said given instruction to identify a processor instruction and operands.

8. The method according to claim 1, further comprising:

identifying one or more operations to be used to simulate said given instruction, if said compiled data is not in said data structure; and decoding said given instruction into one or more parameters, if said compiled data is not in said data structure.

9. The method according to claim 8, wherein said one or more operations comprise LISA (Language for Instruction-Set Architectures) operations.

10. The method according to claim 9, wherein said information comprises identifiers of pre-compiled functions operable to implement LISA (Language for instruction-Set Architectures) operations.

11. The method according to claim 1, wherein determining if said compiled data is stored at said address in said memory table comprises:

matching a key in said memory table with a code for said given instruction; and retrieving said code from an instruction register in said simulator.

12. The method according to claim 2, where returning said compiled data comprises returning a reference to said compiled data to a program simulation.

13. The method according to claim 2, further comprising:

identifying one or more operations to be used to simulate said given instruction, if said compiled data is not in said data structure; and decoding said given instruction into one or more parameters, if said compiled data is not in said data structure.

14. The method according to claim 13, where returning said compiled data comprises invoking a function call to implement one of said operations.

15. The method according to claim 13, wherein said one or more operations comprise LISA (Language for Instruction-Set Architectures) operations.

16. The method according to claim 15, wherein said information comprises identifiers of pre-compiled functions operable to implement LISA (Language for Instruction-Set Architectures) operations.

17. The method according to claim 2, wherein verifying that said compiled data at said given location in said cache table is related to said given instruction, and not a different instruction that was previously executed at a same instruction address as the given instruction comprises matching a key in said memory table with a code for said given instruction from an instruction register in said simulator to determine.

* * * * *

UNITED STATES PATENT AND TRADEMARK OFFICE
CERTIFICATE OF CORRECTION

| | | |
|---|---|---|
| PATENT NO. | : 8,554,535 B2 | Page 1 of 1 |
| APPLICATION NO. | : 13/338155 | |
| DATED | : October 8, 2013 | |
| INVENTOR(S) | : Achim Nohl et al. | |

It is certified that error appears in the above-identified patent and that said Letters Patent is hereby corrected as shown below:

In The Claims

Column 14, line 67, replace the word "pervious" with --previous--.

Column 15, line 9, replace the word "reuniting" with --returning--.

Signed and Sealed this
Third Day of February, 2015

Michelle K. Lee
*Deputy Director of the United States Patent and Trademark Office*